United States Patent
Tong et al.

(10) Patent No.: US 9,444,135 B2
(45) Date of Patent: Sep. 13, 2016

(54) INTEGRATED CIRCUIT PACKAGE

(71) Applicants: Ziqiang Tong, Munich (DE); Ralf Reuter, Munich (DE)

(72) Inventors: Ziqiang Tong, Munich (DE); Ralf Reuter, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 89 days.

(21) Appl. No.: 14/490,849

(22) Filed: Sep. 19, 2014

(65) Prior Publication Data

US 2016/0087333 A1 Mar. 24, 2016

(51) Int. Cl.
*H01Q 1/38* (2006.01)
*H01Q 1/40* (2006.01)
*H01Q 9/04* (2006.01)

(52) U.S. Cl.
CPC .............. *H01Q 1/40* (2013.01); *H01Q 9/0407* (2013.01); *H01Q 9/0414* (2013.01)

(58) Field of Classification Search
CPC . H01Q 19/10; H01Q 19/185; H01L 31/0203
USPC .................................. 343/700 MS, 834, 836
See application file for complete search history.

(56) References Cited

U.S. PATENT DOCUMENTS

| | | | |
|---|---|---|---|
| 6,563,712 B2 | 5/2003 | Akram | |
| 6,982,674 B2 | 1/2006 | Matsubara et al. | |
| 7,126,541 B2 | 10/2006 | Mohamadi | |
| 7,126,542 B2 | 10/2006 | Mohamadi | |
| 7,728,774 B2 | 6/2010 | Akkermans | |
| 7,808,439 B2 | 10/2010 | Yang et al. | |
| 7,886,421 B2 | 2/2011 | Hwan | |
| 7,999,753 B2 | 8/2011 | Gaucher | |
| 8,169,060 B2 | 5/2012 | Maurer et al. | |
| 8,199,060 B2 * | 6/2012 | Rofougaran | ............ H01L 23/66 343/700 MS |
| 8,283,764 B2 | 10/2012 | Tang | |

(Continued)

FOREIGN PATENT DOCUMENTS

EP  1367668 A1  12/2003
EP  1923950 A1  5/2008

(Continued)

OTHER PUBLICATIONS

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.

(Continued)

*Primary Examiner* — Hoanganh Le
(74) *Attorney, Agent, or Firm* — Charlene R. Jacobsen

(57) ABSTRACT

An integrated circuit package has a first side and an opposite second side. The integrated circuit package comprises: a stack of layers comprising at least a first and second electrically isolating layers, a dielectric material arranged on the stack of layers at the second side for encapsulating the integrated circuit package, a first integrated antenna structure for transmitting and/or receiving a first radio frequency signal, and a first array of electrically conductive vias extending through at least the first electrically isolating layer and the dielectric material. The first integrated antenna structure is arranged between the first and second electrically isolating layers and is surrounded by the electrically conductive vias which are electrically connected to respective first metal patches arranged on the dielectric material at the second side.

19 Claims, 7 Drawing Sheets

(56) References Cited

U.S. PATENT DOCUMENTS

| | | | |
|---|---|---|---|
| 8,305,280 B2 | 11/2012 | Brown et al. | |
| 8,460,967 B2 | 6/2013 | Lachner | |
| 8,497,804 B2* | 7/2013 | Haubrich | A61N 1/37229 |
| | | | 343/700 MS |
| 8,633,858 B2* | 1/2014 | Nair | C03C 3/19 |
| | | | 29/600 |
| 8,860,532 B2 | 10/2014 | Gong et al. | |
| 2007/0080864 A1* | 4/2007 | Channabasappa | H01Q 9/0442 |
| | | | 343/700 MS |
| 2008/0197469 A1 | 8/2008 | Yang | |
| 2008/0272964 A1 | 11/2008 | Su | |
| 2009/0015485 A1 | 1/2009 | Floyd | |
| 2011/0234472 A1 | 9/2011 | Maurer | |
| 2012/0013499 A1 | 1/2012 | Hayata | |
| 2012/0086114 A1 | 4/2012 | Zhao | |
| 2012/0104574 A1 | 5/2012 | Boeck | |
| 2012/0119969 A1 | 5/2012 | MacDonald et al. | |
| 2012/0128291 A1 | 5/2012 | Teitelbaum | |
| 2012/0188138 A1 | 7/2012 | Liu | |
| 2012/0274419 A1 | 11/2012 | Lee et al. | |
| 2013/0207274 A1 | 8/2013 | Liu | |
| 2015/0364830 A1* | 12/2015 | Tong | H01Q 19/10 |
| | | | 342/27 |

FOREIGN PATENT DOCUMENTS

| | | |
|---|---|---|
| EP | 2500978 B1 | 7/2013 |
| WO | 2012140422 A2 | 10/2012 |

OTHER PUBLICATIONS

Deslandes, Dominic, "Design Equations for Tapered Microstrip-to-Substrate Integrated Waveguide Transitions," 2010 IEEE MTT-S International Microwave Symposium Digest (MTT); May 23-28, 2019, pp. 704-707.

Glogowski, R. et al., "Double Resonance Transition from Rectangular Waveguide to Substrate Integrated Waveguide," 2013 IEEE 7th European Conference on Antennas and Propagation (EuCAP); Apr. 8-12, 2013; pp. 3353-3354.

Henawy, M.A., et al., "Integrated Antennas in eWLB Packages for 77 GHz and 79 GHz Automotive Radar Sensors," Proceedings of the 8th European Radar Conference; Oct. 12-14, 2011, Manchester, UK; pp. 424-427.

Keser, B. et al., "The Redistributed Chip Package: A Breakthrough for Advanced Packaging," Proceedings of the 57th IEEE Electronic Components and Technology Conference, 2007; May 29, 2007-Jun. 1, 2007; pp. 286-291.

Lamy, Y. et al., "mmW Characterization of Wafer Level Passivation for 3D Silicon Interposer," 2013 IEEE 63rd Electronic Components & Technology Conference; May 28-31, 2013; pp. 1187-1981.

Pohl, N. et al., "An UWB 80GHz FMCW Radar System Using a SiGe Bipolar Transceiver Chip Stabilized by a Fractional-N Pll Synthesizer," IEEE Transactions on Microwave Theory and Techniques, vol. 60, No. 3, Mar. 2012, pp. 757-765.

Schmid, C.M. et al., "A 77-GHz FMCW Radar Transceiver MMIC / Waveguide Integration Approach," 2013 IEEE MTT-S International Microwave Symposium Digest (IMS); Jun. 2-7, 2013; pp. 1-4.

U.S. Appl. No. 14/303,707, filed Jun. 13, 2014, entitled "Integrated Circuit Package with Radio Frequency Coupling Arrangement".

U.S. Appl. No. 14/303,705, filed 13 Jun. 2014, entitled "Radio Frequency Coupling Structure".

U.S. Appl. No. 14/303,713, filed Jun. 13, 2014, entitled "Integrated Circuit Package with Radio Frequency Coupling Structure".

Alleaume, P.F., et al., "Millimeter-wave SMT Low Cost Plastic Packages for Automotive Radar at 77GHz and High Data Rate E-band Radios," 2009 IEEE MTT-S International Microwave Symposium Digest (IMS), Jun. 7-12, 2009; pp. 789-792.

Do-Hoon, K. et al., "A Wideband Vertical Transition Between Co-Planar Waveguide and Parallel-Strip Transmission," IEEE Microwave and Wireless Components Letters, vol. 15, No. 9, Sep. 2005, pp. 591-593.

U.S. Appl. No. 14/473,038, filed Aug. 29, 2014, entitled "Radio Frequency Coupling Structure and a Method of Manufacturing Thereof".

Fischer, A. et al., "A 77-GHz antenna and fully integrated radar transceiver in package," International Journal of Microwave and Wireless Technologies 2012; vol. 4, issue 4; Aug. 2012; 7 pages.

Fischer, A. et al., "A 77-GHz Antenna in Package," 2011 IEEE 41st European Microwave Conference, Oct. 10-13, 2011; pp. 1316-1319.

Wojnowski, M. et al., "A 77-GHz SiGe Single-Chip Four-Channel Transceiver Module with Integrated Antennas in Embedded Wafer-Level BGA Package," IEEE 62nd Electronic Components and Technology Conference; May 29, 2012-Jun. 1, 2012; pp. 1027-1032.

Yang, F. et al., "Microstrip Antenna Integrated With Electromagnetic Band-Gap (EBG) Structures: A Low Mutual Coupling Design for Array Applications," IEEE Transaction on Antennas and Propagation, vol. 51, N. 10; Oct. 2003; pp. 2936-2946.

Non-Final Office Action mailed Jan. 14, 2016 for U.S. Appl. No. 14/303,705, 7 pages.

Non-Final Office Action mailed Feb. 17, 2016 for U.S. Appl. No. 14/303,713, 15 pages.

Non-Final Office Action mailed Feb. 16, 2016 for U.S. Appl. No. 14/303,713, 15 pages.

\* cited by examiner

INTEGRATED CIRCUIT PACKAGE

CROSS REFERENCE TO RELATED APPLICATION(S)

The present application is related to co-pending U.S. patent application Ser. No. 14/303,705, entitled "RADIO FREQUENCY COUPLING STRUCTURE," filed on Jun. 13, 2014; co-pending U.S. patent application Ser. No. 14/303,707, entitled "INTEGRATED CIRCUIT PACKAGE WITH RADIO FREQUENCY COUPLING ARRANGEMENT," filed on Jun. 13, 2014; co-pending U.S. patent application Ser. No. 14/303,713, entitled "INTEGRATED CIRCUIT PACKAGE WITH RADIO FREQUENCY COUPLING STRUCTURE," filed on Jun. 13, 2014; and co-pending U.S. patent application Ser. No. 14/473,038, entitled "RADIO FREQUENCY COUPLING STRUCTURE AND A METHOD OF MANUFACTURING THEREOF," filed on Aug. 29, 2014, the entirety of which are herein incorporated by reference.

FIELD OF THE INVENTION

This invention relates to an integrated circuit package and an integrated circuit package assembly.

BACKGROUND OF THE INVENTION

An integrated circuit package may integrate radio frequency (RF) active and/or passive components. Such integrated circuit package may for example integrate a radiating element and transmit an RF signal via the radiating element. Alternatively or additionally the integrated circuit package may receive the RF signal via the radiating element. The radiating element may be designed to ensure radiation of the RF signal in a direction perpendicular to a plane of the package.

Techniques are described in literature to improve the radiation of the RF signal in a direction perpendicular to a plane of the package.

An example of such techniques is described in Wojnowski, M.; Wagner C.; Lachner, R.; Böck, J.; Sommer, G.; Pressel, K., "A 77-GHz SiGe Single-Chip Four-Channel Transceiver Module with Integrated Antennas in Embedded Wafer-Level BGA Package", in *IEEE 62nd Electronic Components and Technology Conference* (ECTC 2012), pg. 1027-1032, San Diego, Calif. May 29-Jun. 1, 2012, hereinafter referred as "Wojnowski". Wojnowski describes a 77-GHz silicon-germanium (SiGe) single-chip four-channel transceiver module with four integrated antennas assembled in an embedded wafer-level ball grid array package (e-WLB package). The module includes the four antennas integrated in the e-WLB package and realized using a thin-film redistribution layer (RDL) in the e-WLB package. The e-WLB package is mounted on a printed circuit board (PCB) via solder balls. A metal layer on top of the PCB is used as a reflector to enhance radiation of the RF signal in the direction perpendicular to the plane of e-WLB package and opposite to the PCB.

SUMMARY OF THE INVENTION

The present invention provides an integrated circuit package and an integrated circuit package assembly as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
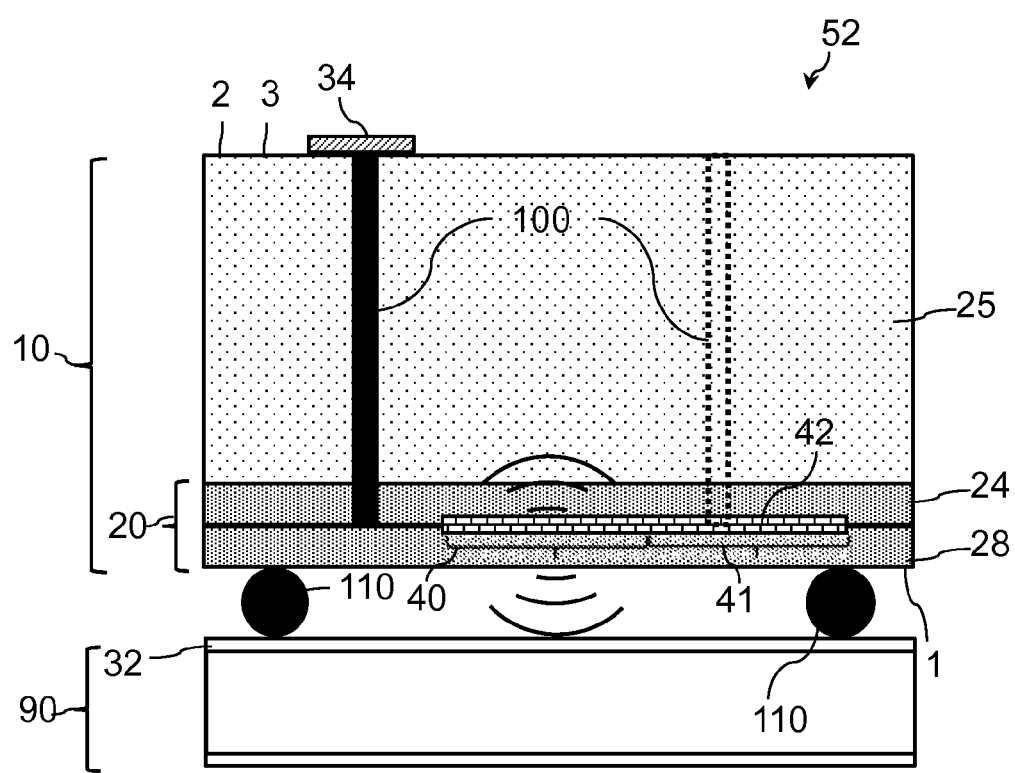
FIG. 1 shows a cross-section of an example of an integrated circuit package assembly taken along the line I-I in FIG. 2.
Figure 2:
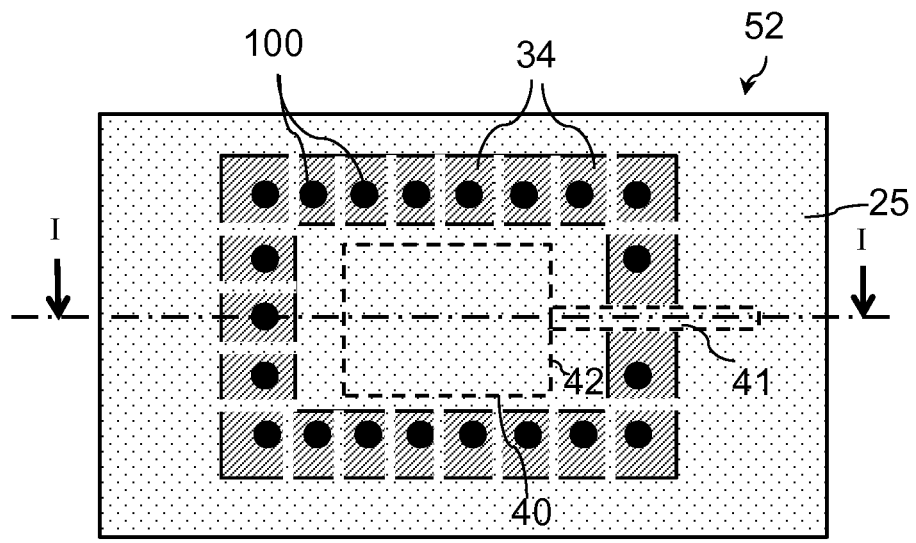
FIG. 2 shows a top view of the example shown in FIG. 1.

FIGS. 1 and 2 show a cross-section and a top view of an example of an integrated circuit package assembly 52. The cross-section shown in FIG. 1 is taken along the line I-I of the top view shown in FIG. 2.

The integrated circuit package assembly 52 comprises an integrated circuit package 10 and a printed circuit board (PCB) 90 used to mount the integrated circuit package 10 on the printed circuit board 90. The integrated circuit package 10 has a first side 1 and a second side 2. The second side 2 is opposite to the first side 1. The integrated circuit package 10 is mounted on the PCB 90 at the first side 1. The integrated circuit package 10 may be mounted on the PCB 90 by for example one or more solder balls 110.

The integrated circuit package 10 comprises a stack of layers 20, a dielectric material 25, a first integrated antenna structure 42 and a first array of electrically conductive vias 100.

The stack of layers 20 is arranged at the first side 1 of the integrated circuit package 10. The stack of layers 20 comprises at least a first electrically isolating layer 24 and a second electrically isolating layer 28. The dielectric material 25 is arranged on the stack of layers 20 at the second side 2. The dielectric material 25 is used to encapsulate the integrated circuit package 10. The dielectric material 25 may be for example a plastic moulding compound.

The first integrated antenna structure 42 is arranged between the first electrically isolating layer 24 and the second electrically isolating layer 28. The first integrated antenna structure 42 is used to transmit a first radio frequency (RF) signal. Alternatively or additionally, the integrated antenna structure 42 may be arranged to receive the first RF signal.

The first integrated antenna structure 42 may be a suitable type of integrated planar antenna of one of the group consisting of: a single-ended microstrip antenna, a differential microstrip antenna, a rectangular patched single-ended antenna, a rectangular patched differential antenna, a square patched single-ended antenna, and a square patched differential antenna. The integrated antenna structure 42 may be, as shown in FIG. 1, sandwiched between the first electrically isolating layer 24 and the second electrically isolating layer 28.

The integrated antenna structure 42 may be implemented in any manner suitable for the specific implementation.

For example, as shown in FIG. 2, the integrated antenna structure 42 may be a planar rectangular patched single-ended antenna. The planar rectangular patched single-ended antenna 42 may comprise a transmission line 41 and a planar rectangular patched element 40. The transmission line 41 may feed the rectangular patched element 40. The transmission line 41 may extend in a planar direction defined by the planar rectangular patched element 40. The transmission line 41 may be electrically connected or coupled to a transceiver, a transmitter and/or a receiver (not shown in FIG. 2). The rectangular patched element 40 and the transmission line 41 may be both made of a high conductive metal, e.g. copper.

However, the first integrated antenna structures 42 may be a non-planar single-ended or differential integrated antenna arranged between two or more electrically isolating layers of the stack of layers 20. The first integrated antenna structure 42 may be formed with two or more electrically conductive layers, e.g. made of copper, arranged between the two or more electrically isolating layers. The two or more electrically conductive layers may be connected together via electrically conductive via holes extending through the two or more electrically isolating layers. For example, the first integrated antenna structure 42 may have more than two or more patches. Each patch may be located in a different electrically conductive layer. The two or more patches may be electrically connected together via the electrically conductive via holes extending through the two or more electrically isolating layers.

Referring to FIG. 1, the electrically conductive vias 100 are extending through at least the first electrically isolating layer 24 and the dielectric material 25.

The PCB 90 comprises an electrically conductive layer 32. The electrically conductive layer 32 may be a top metal layer of the PCB 90. Alternatively, the electrically conductive layer 32 may be an intermediate or a bottom layer of the PCB 90.

The electrically conductive layer 32 may be separated from the first integrated antenna structure 42 by at least the second electrically conductive layer 28. The first integrated antenna structure 42 is arranged to partly overlap the electrically conductive layer 32. The electrically conductive layer 32 is arranged to reflect to the second side 2 the first RF signal received by the first integrated antenna structure 42 through at least the second electrically isolating layer 28. The electrically conductive layer 32 may be made of high electrical conductivity material, for example copper. The electrically conductive layer 32 may be electrically connected to a reference potential. The reference potential may be for example ground or a negative potential.

The first RF signal may be generated by a transceiver (not shown in FIG. 1) electrically coupled to the integrated antenna structure 42 and therefrom radiated towards the electrically conductive layer 32. The first RF signal may be originated at the second side 2 from a device (not show in the FIG. 1) external to the integrated circuit package 10. The first RF signal may thus be directly received from the second side 2 by the integrated antenna structure 42 or indirectly received by the integrated antenna structure 42 via one or multiple reflections in the electrically conductive layer 32.

The first integrated antenna structure 42 is surrounded by the electrically conductive vias 100. The electrically conductive vias 100 are connected to respective metal patches 34 arranged on the dielectric material 25 at the second side 2. The metal patches 34 are separated from the integrated antenna structure 42 by at least the dielectric material 25 and the first electrically isolating layer 24.

During operation, electromagnetic waves distribute inside the integrated circuit package 10 through the dielectric material 25. In absence of the electrically conductive vias 100 and the metal patches 34, the electromagnetic waves travel away from the integrated antenna structure 42 through the dielectric material 25. Further, surface electromagnetic waves travel away from the integrated antenna structure 42 through a top surface 3 of the dielectric material 25. In absence of the electrically conductive vias 100 and the metal patches 34, the performance of the integrated antenna structure 42 may be degraded.

The electrically conductive vias 100 shield the integrated antenna structure 42 in the dielectric material 25. The metal patches 34 attenuate the surface electromagnetic waves in the dielectric material 25. By having the integrated antenna structure 42 surrounded by the electrically conductive vias 100 having at one extremity the metal patches 34, the surface electromagnetic waves in the dielectric material 25 may be substantially suppressed and the performance of the integrated antenna structure 42 may be improved. A radiation beam of the integrated antenna structure 42 may be more uniformly distributed in the space surrounding the integrated antenna structure 42.

The metal patches 34 may be shaped to form a so-called mushroom structure on the dielectric material 25. The metal patches 34 of the mushroom structure may be separated by a gap and electrically disconnected as shown in FIG. 2. The gap and size of the metal patches 34 may be shaped in function of the frequency of operation of the integrated antenna structure 42. The metal patches 34 may be separated between them by a predetermined pitch. The metal patches 34 may be metal areas or pieces of metals or metal pads. The metal patches 34 may be of any shape, for example be of a rectangular or squared or rounded shape. The plurality of metal patches 34 and the array of electrically conductive vias 100 form an electromagnetic band-gap (EBG) structure. The EBG structure shown in FIG. 2 is a so-called mushroom-like EBG. However, the EBG may be different than a mushroom-like EBG.

Figure 3:
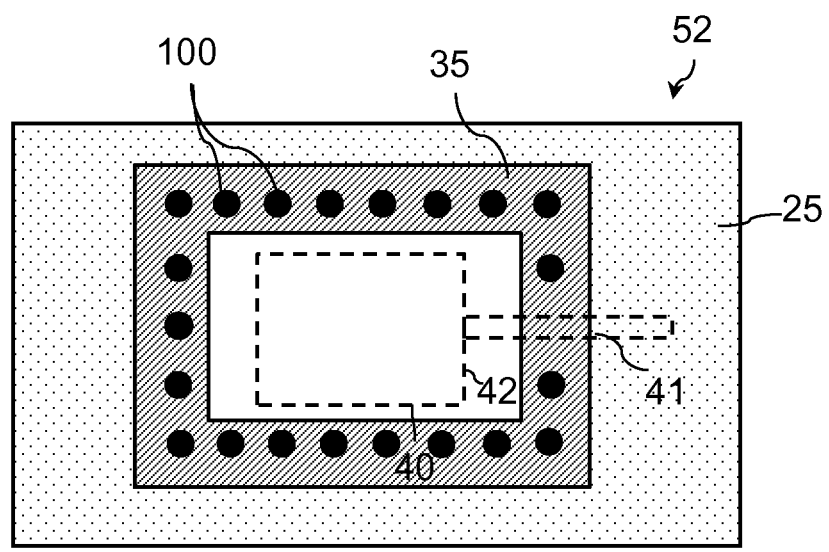
FIG. 3 shows an alternative top view of the example shown in FIG. 1.

The integrated circuit package assembly 52 may have a different top view. For example, referring to the top view shown in FIG. 3, this differs from the top view shown in FIG. 2 in that the metal patches may be electrically connected together between them to form a metal path 35 substantially surrounding the integrated antenna structure 42. For example, the metal path 35 may be closed to form a first ring surrounding the integrated antenna structure 42. Alternatively, the metal path electrically connecting the metal patches may be open, e.g. in correspondence of an input feeding the integrated antenna structure 42 with the first RF signal, i.e. the input transmission line 41 in this example.

Figure 4:
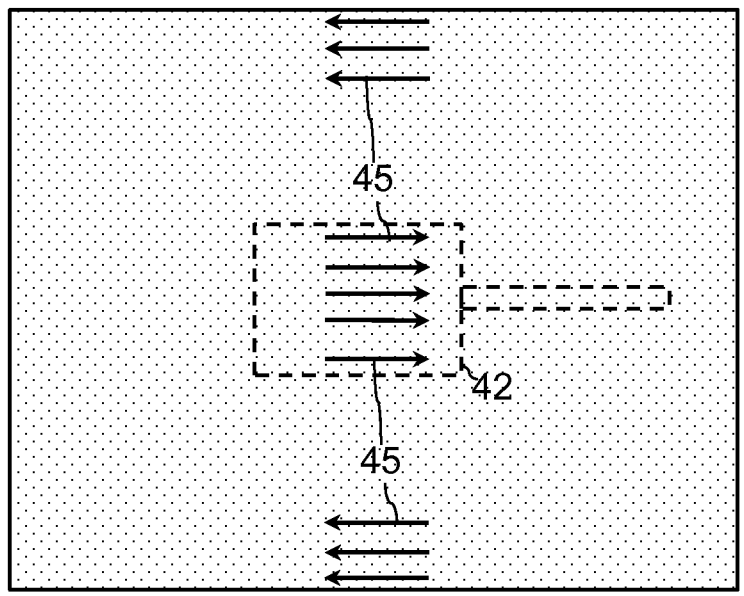
FIG. 4 schematically shows the distribution of the electric field in a prior-art integrated circuit package.
Figure 5:
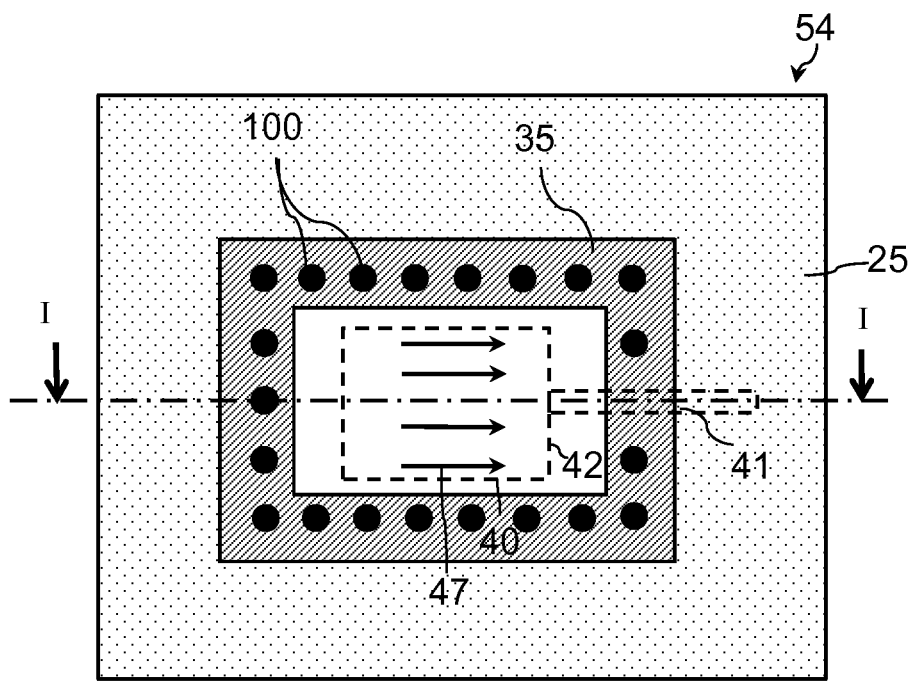
FIG. 5 shows the distribution of the electric field in the example shown in FIG. 3.

To better understand the effect on the propagation of the electric field, FIG. 4 shows the distribution of electric field (E-field) lines 45 in an integrated antenna structure 42 without a BGA structure, while FIG. 5 shows the distribution of E-field lines 47 in the integrated antenna structure 42 according to the invention. The E-field lines are indicated in both FIG. 4 and FIG. 5 with arrows. The distributions of the E-field lines 45 and 47 are derived from electromagnetic simulations. The length of the arrows is proportional to the intensity of the electric field.

In FIG. 4, the E-filed lines are spreading inside and outside the integrated antenna structure 42 (drawn with a dashed line), causing the propagation of the surface electromagnetic waves to areas of the package distant from the integrated antennas structure 42. The E-field lines change phase at a distance from the integrated antennas structure 42. Intensity of E-field is relatively large at area of the package close to the integrated antenna structure 42 but also far from integrated antennas structure 42 and close to side edges of the package.

In FIG. 5, the E-field lines 47 are substantially confined within an area of the integrated circuit package delimited by the integrated antenna structure 42 and surrounded by the electrically conductive vias 100 and the metal ring 35. The E-field lines 47 are concentrated inside the closed metal path 35. The E-field outside the closed metal path 35 are substantially eliminated, i.e. their intensity is substantially reduced to negligible values. This effect greatly improves the performance of the integrated antenna structure 42. The integrated antenna structure 42 is better electrically isolated from the external electromagnetic interference, compared to the integrated antenna structure 42 without BGA structure shown in FIG. 4.

Figure 6:
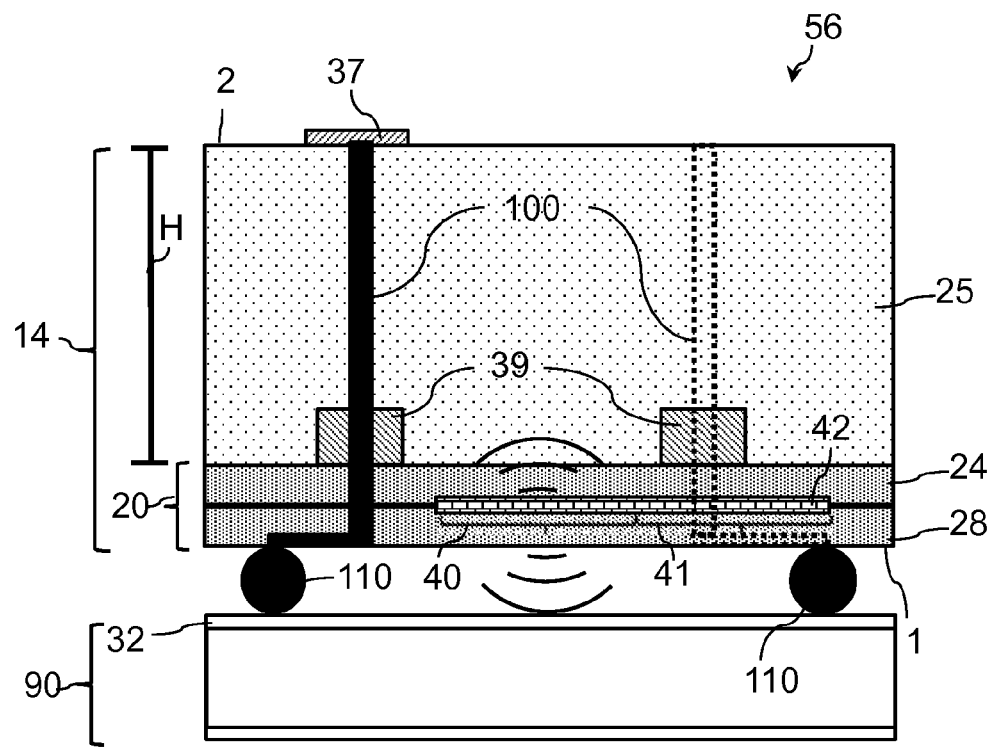
FIG. 6 shows a cross-section of an example of an integrated circuit package assembly taken along the line VI-VI in FIG. 7.

FIG. 6 shows a cross-section of another example of an integrated circuit package assembly 56. The integrated circuit package assembly 56 comprises an integrated circuit package 14. The integrated circuit package 14 differs from the integrated circuit package 10 in that the electrically conductive vias 100 are electrically connected by a metal wall 39 surrounding the integrated antenna structure 42. The metal wall 39 is encapsulated by the dielectric material 25 and partially extending though the dielectric material 25. The metal wall 39 may be for example electrically connected to the electrically conductive vias 100 and through at least the first electrically isolating layer 24 and the second electrically isolating layer 28 being electrically connected to one or more of the solder balls 110. The solder balls 110 may for example be electrically connected directly to the electrically conductive layer 32. The metal wall 39 may be for example a thick metal layer hollowed in an area of the integrated circuit package 14 corresponding to the planar rectangular patched element 40. The metal wall 39 may be part of a so-called embedded ground plane (EGP) and connected to the reference potential.

Since the electrically conductive vias 100 are spaced in the dielectric material 25, the metal wall 39 may fill with metal a space between the electrically conductive vias 100 for as long as the metal wall 39 extends through the dielectric material 25, thereby improving the shielding.

When the metal patches are electrically connected to each other to form a metal path 37, the metal path 37 may be open in an area of the metal path 37 corresponding for example to the transmission line 41. For example, as shown in FIG. 7, the metal path 37 has an opening 38 overlapping the transmission line 41.

Figure 7:
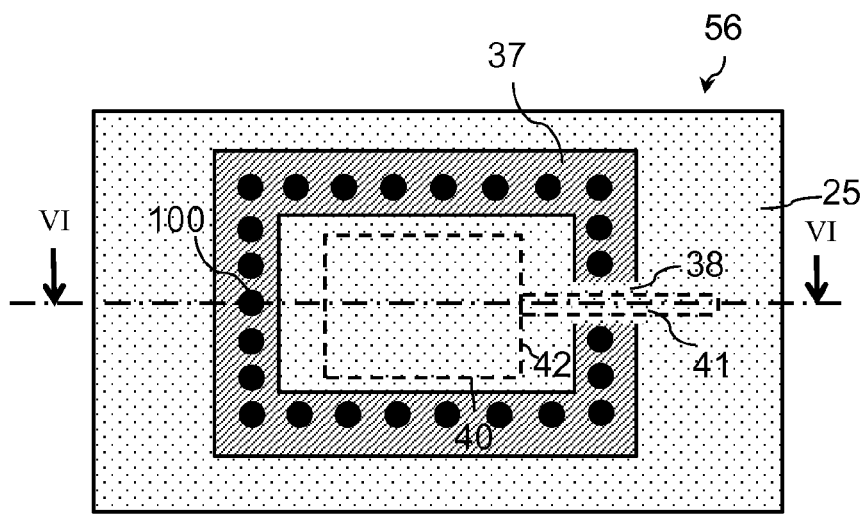
FIG. 7 shows a top view of the example shown in FIG. 6.

Whether the metal path electrically connecting the metal patches on the dielectric material 25 forms the closed metal path 35 of FIG. 5, or the open metal path 36 of FIG. 7, is a design choice and depends on a thickness of the dielectric material 25 in relation to the operating frequency.

Referring to FIG. 6, the dielectric material 25 has a thickness H. For a thickness H of the dielectric material 25 larger than one-quarter of wavelength, the effect of the surface electromagnetic waves becomes notable and the performance of the integrated antenna structure 42 may be further degraded. The effect of the surface electromagnetic waves becomes stronger for larger sizes of the integrate circuit package 14, e.g. for sizes of the integrated circuit package 14 larger than e.g. one wavelength square. Furthermore, when the integrated circuit package 42 is electrically coupled to an integrated circuit die in the package 14, as it will be shown later in the figures, further degradation of the performance of the integrated antenna structure 42 can be observed due to surface electromagnetic waves reflection on the integrated circuit die.

In order to prevent such degradation of the performance, the metal path surrounding the integrated antenna structure 42 may be adjusted in function of the thickness H. For example, for H larger than one-quarter of wavelength, the metal path may be closed. For intermediate thicknesses, e.g. for H smaller than 0.1 wavelength, e.g. 0.2 mm, the metal path may be open e.g. in correspondence of the transmission line 41 as shown in FIG. 7.

Figure 8:
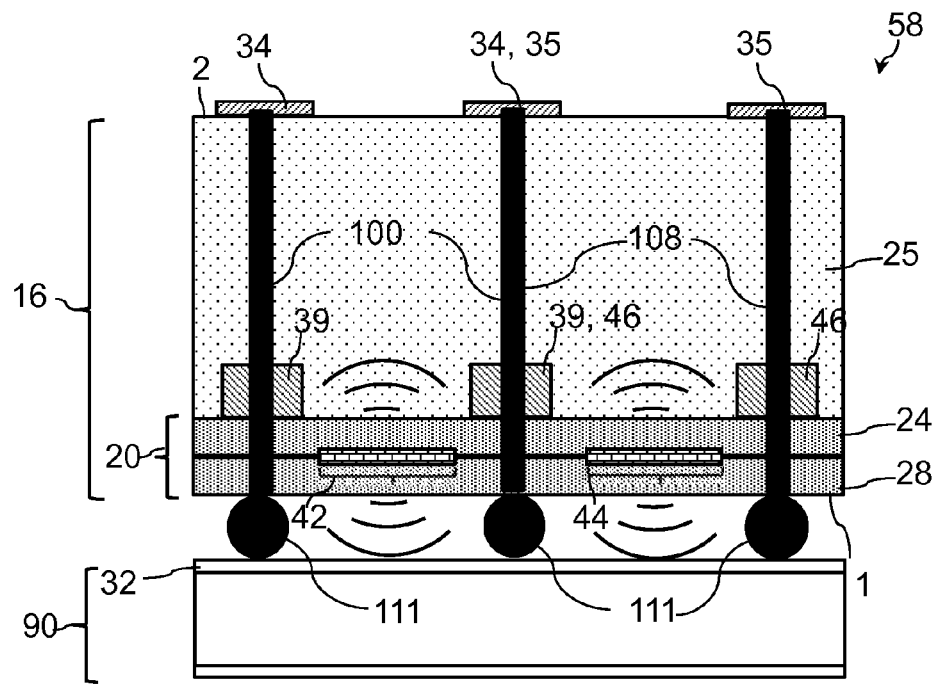
FIG. 8 shows a cross-section of an example of an integrated circuit package assembly taken along the line VIII-VIII in FIG. 10.

FIG. 8 shows a cross-section of another example of an integrated circuit package assembly 58. The cross-section is taken along the line VIII-VIII in FIG. 10.

The integrated circuit package assembly 58 comprises an integrated circuit package 16. The integrated circuit package 16 comprises the first integrated antenna structure 42 and a second integrated antenna structure 44. The second integrated antenna structure 44 may be arranged between the first electrically isolating layer 24 and the second electrically isolating layer 28. The integrated circuit package 16 comprises a second array of electrically conductive vias 108 extending through at least the first electrically isolating layer 24 and the dielectric material 25. The electrically conductive vias 108 surround the second integrated antenna structure 44. The electrically conductive vias 108 are electrically connected to respective second metal patches 35 arranged on the dielectric material 25 at the second side 2. The second respective metal patches 35 are separated from the second electrically integrated antenna structure 44 by at least the dielectric material 25 and the first electrically isolating layer 24. In FIG. 8 the first array and the second array are partly overlapping such that part of the electrically conductive vias 100 of the first array are in common with part of the electrically conductive vias 108 of the second array. However, the second array may be separated from the first array, closely adjacent, or otherwise arranged.

The respective second metal patches 35 may be arranged as the respective first metal patches 34. For example, the respective second metal patches 35 may be arranged in a mushroom structure, or be electrically connected to form a second metal path. The second metal path may be closed to form a metal ring surrounding the second integrated antenna structure 44. The second metal path may be open in an area of the second metal path corresponding to an input of the second integrated antenna structure 44.

The integrated circuit package 16 further comprises a second metal wall 46 electrically connecting the second electrically conductive vias 108. The second metal wall 46 is arranged as the first metal wall 39. In FIG. 8 part of the second metal wall 46 coincides with part of the first metal wall 39 and arranged between the first integrated antenna structure 42 and the second integrated antenna structure 44. However, the second metal wall 46 may be separated from the first metal wall 39, closely adjacent or otherwise arranged.

Figure 9:
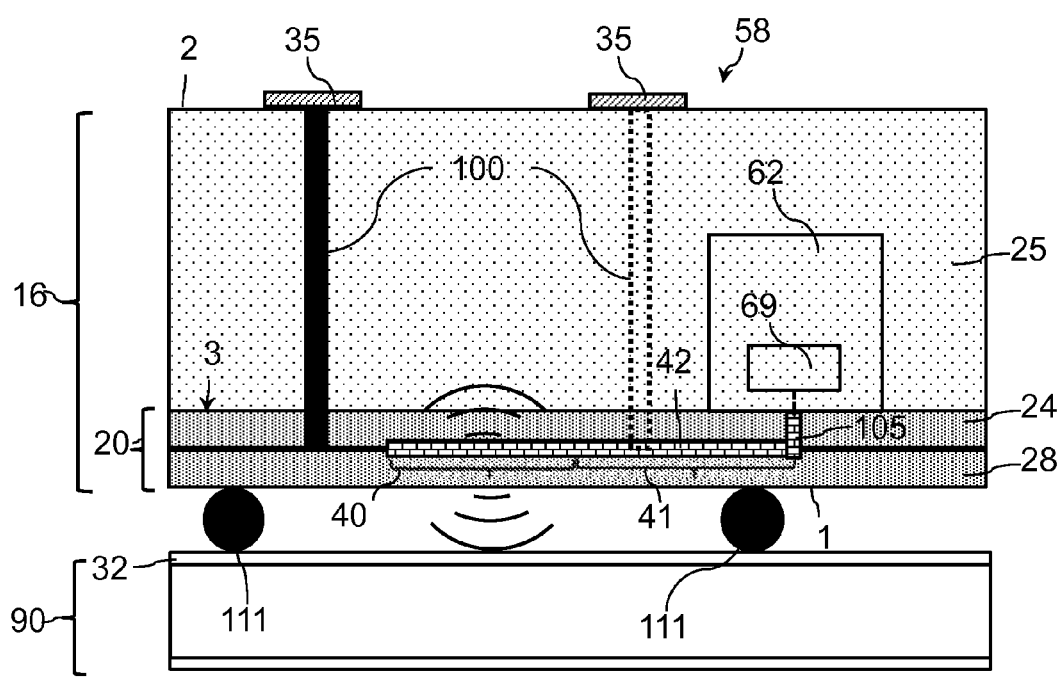
FIG. 9 shows a cross-section of an example of an integrated circuit package assembly taken along the line IX-IX in FIG. 10.

FIG. 9 shows another cross-section of the integrated circuit package 58. The cross-section shown in FIG. 9 is taken along the line IX-IX in FIG. 10.

The first integrated antenna structure 42 may be electrically coupled, e.g. via the transmission line 41 and one or more electrically conductive vias 105 extending through at least the first electrically isolating layer 24, to an integrated circuit die 62.

The second integrated antennas structure 44 (not shown in FIG. 9) may be electrically coupled to the integrated circuit die 62 in a similar manner.

The integrated circuit die 62 may be arranged to generate the first RF signal. The first RF signal may be transmitted via the first integrated antenna structure 42. The integrated circuit die 62 may be arranged to receive the first RF signal as received via the first integrated antenna structure 42. The integrated circuit package 16 is mechanically attached to the PCB 90 via the solder balls 111. The integrated circuit package 16 is electrically coupled to the PCB 90 to guide the RF signal out of a plane parallel to a surface 3 of the first electrically isolating layer 24. The surface 3 is in direct contact with the dielectric material 25. The first RF signal may be directly transmitted away from integrated circuit package 16 towards the second side 2 of the package 16 via the integrated antenna structure 42. Alternatively or additionally, the first RF signal may be indirectly transmitted away from integrated circuit package 16 towards the second side 2 of the package 16 via the integrated antenna structure 42 and via one or more reflections of the first RF signal with the electrically conductive material 32. The first RF signal may be received from the second side 2 and directed towards the integrated circuit package 16. The first RF signal may be directly received by the first integrated antenna structure 42 from the second side 2. Alternatively or additionally, the first RF signal may be indirectly received by the first integrated antenna structure 42 from the second side 2 after one or more reflections with the electrically conductive material 32. As shown in FIG. 9, the electrically conductive layer 32 may be formed in the PCB 90. The first integrated antenna structure 42 may partly or entirely overlap a first area of the electrically conductive layer 32. The first area may be completely overlapped by the planar rectangular patch element 40.

The integrated circuit die 62 may be arranged inside the integrated circuit package 16 as shown in FIG. 9. The integrated circuit die 62 may have a face in direct contact with the surface 3 of the stack 20. The integrated circuit die 62 may be soldered to the surface 3 and in electrical contact with the integrated antenna structure 42 via one or more electrically conductive via holes 105 extending through at least the first electrically isolating layer 24. Alternatively, in an example not shown in the Figures, the integrated circuit die 62 may be arranged outside the integrated circuit package 16 and electrically connected to the integrated antenna structure 42 via for example a lead terminal of the integrated circuit package 16.

The integrated circuit die 62 may comprise a circuit arranged to generate the first RF signal. Alternatively or additionally, the circuit may be arranged to receive the first RF signal as received via the integrated antenna structure 42. The circuit may be of any type suitable for the specific implementation.

For example, the integrated circuit die 62 may comprise a circuit 69 of the group of circuits consisting of: a transceiver, a receiver and a transmitter.

The integrated circuit die 62 may be manufactured with any semiconductor technology suitable for the specific implementation.

For example, the integrated circuit die 62 may be manufactured using a semiconductor technology of the group of semiconductor technologies comprising: a silicon, a silicon germanium, a gallium arsenide, a gallium nitride semiconductor technology or a combination thereof.

Figure 10:
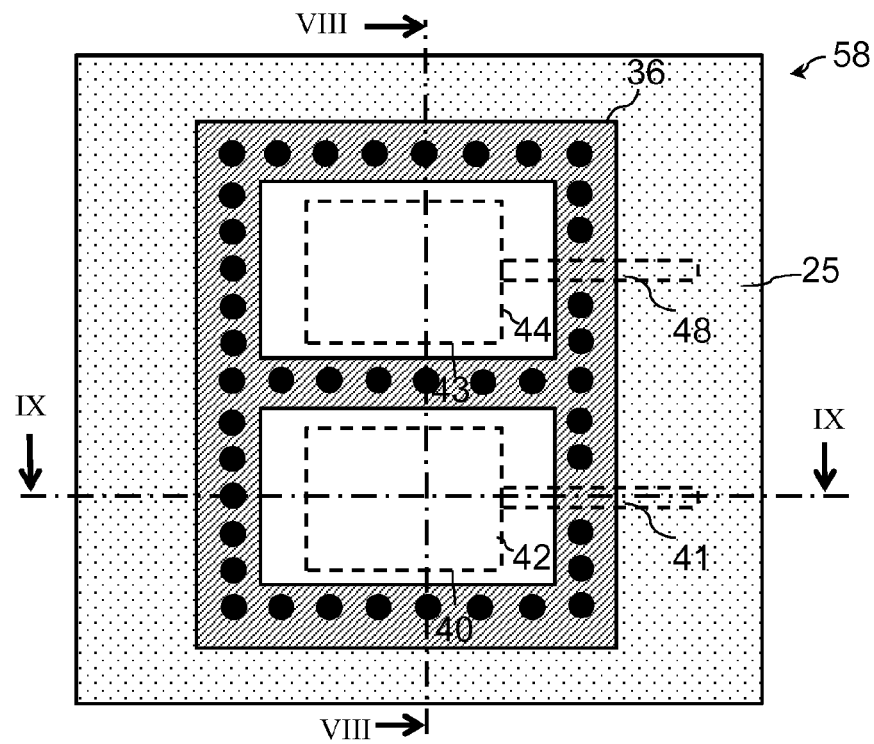
FIG. 10 shows a top view of the example shown in FIGS. 8-10.

FIG. 10 shows a top view of the example of the integrated circuit package assembly 58 shown in FIGS. 8 and 9.

FIG. 10 shows that the second integrated antenna structure 44 may be arranged in the same manner as the first integrated antenna structure 44. The second integrated antenna structure 44 may comprise for example a transmission line 48 and a planar rectangular patched element 43. The transmission line 48 may feed the rectangular patched element 43. The transmission line 48 may extend in a planar direction defined by the planar rectangular patched element 43. The transmission line 48 may be electrically connected or coupled to the integrated circuit die 62.

The integrated circuit die 62 may be arranged to generate a second RF signal. The second RF signal may be transmitted via the second integrated antenna structure 44. The integrated circuit die 62 may be arranged to receive the second RF signal as received via the second integrated antenna structure 42.

The second integrated antenna structure 44 may partly or entirely overlap a second area of the electrically conductive layer 32. The second area may be completely overlapped by the second planar rectangular patch element 43.

By arranging the first integrated antenna structure 42 and the second antenna structure 44 with surrounding electrically conductive vias 100 and 108, and respective first and second metal patches 34 and 35, isolation between the first integrated antenna structure 42 and the second integrated antennas structure 44 may be improved. For example, the first RF signal may be transmitted and/or received in a first predetermined frequency band. The second RF signal may be transmitted and/or received in a second predetermined frequency band. The first predetermined frequency band may partly overlap the second predetermined frequency band. Alternatively, the first predetermined frequency band may not overlap the second predetermined frequency band. The isolation between the first predetermined frequency band and the second predetermined frequency band determines the quality of transmission and/or reception in the respective first and second frequency predetermined bands. The integrated circuit package assembly 58 described with reference to the FIGS. 8-10 may have an isolation between the first predetermined frequency band and the second predetermined frequency band larger than 20 dB.

FIGS. 8 and 10 show that two integrated antenna structures 42 and 44 are integrated in the integrated circuit package 58. However, more than two integrated antenna structure, e.g. an array of antennas, may be integrated in the same manner.

Figure 11:
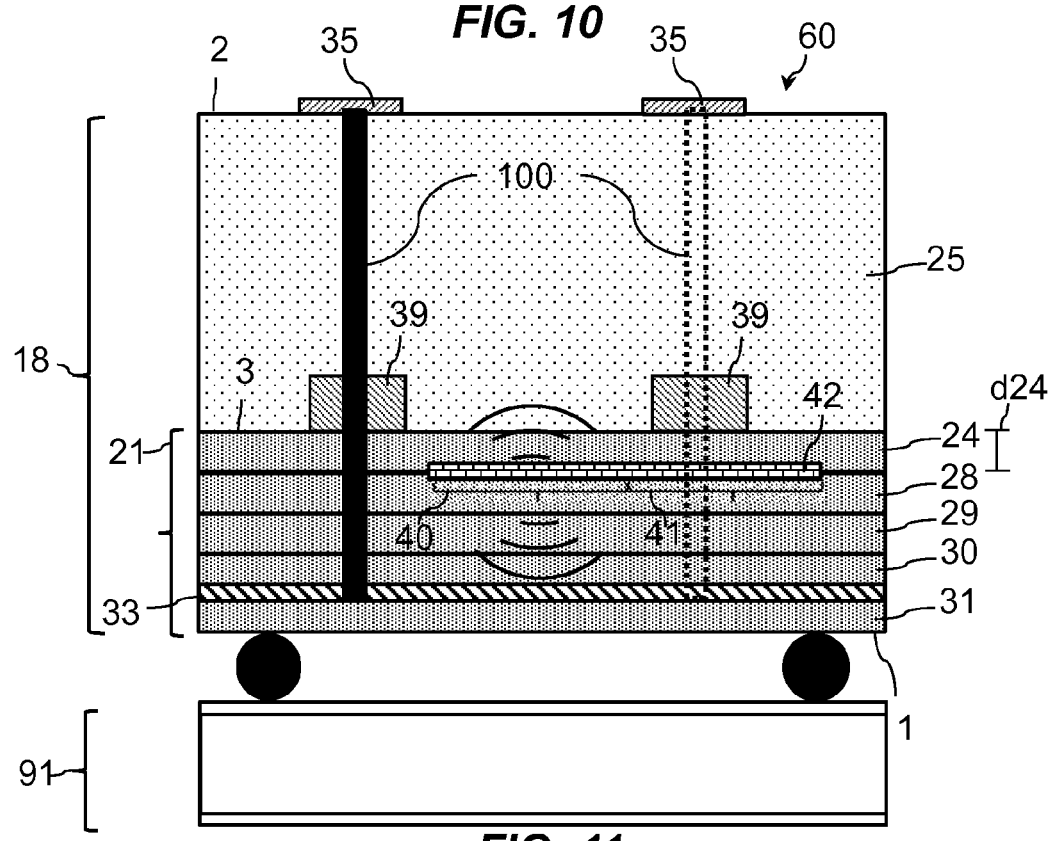
FIG. 11 shows a cross-section of an example of an integrated circuit package assembly.

FIG. 11 shows a cross-section of another example of an integrated circuit package assembly 60. The top view of the example shown in FIG. 11 may be equivalent to the one shown in FIG. 10 along the line IX-IX. The integrated circuit package assembly 60 comprises an integrated circuit package 18. The integrated circuit package 18 comprises a stack 21 of layers comprising the first electrically isolating layer 24, the second electrically isolating layer 28, a third electrically isolating layer 29, a fourth electrically isolating layer 30, a fifth electrically isolating layer 31 and an electrically conductive layer 33 arranged between the fourth electrically isolating layer 30 and the fifth electrically isolating layer 31.

The electrically conductive layer 33 may be used to reflect the first RF signal and/or the second RF signal to the second side 2 of the integrated circuit package 60. The number and thickness of layers in the stack 21 may be chosen to enhance a distance of the first integrated antenna structures 42 to the electrically conductive layer 33.

For example, the first electrically isolating layer 24 may have a thickness d24 in a range between 10 microns to 20 microns. The second electrically isolating layer 28, the third and the fourth electrically isolating layers 29 and 30 may have respective thicknesses substantially equivalent to the thickness d24. For example, the distance between the integrated antenna structure 42 and the electrically conductive layer 33 may be set to obtain an electrical length of the integrated antenna structure 42 substantially equivalent to a quarter wavelength.

Since the integrated circuit package 18 comprises the electrically conductive layer 33 which is used a reflector, the integrated circuit package assembly 60 may be more compact than for example the integrated circuit package assemblies 52, 54, 56 or 58.

The integrated circuit package assemblies 52, 54, 56, 58 or 60 may be used in RF systems of one of the group of RF system comprising: a wireless LAN, an E-band backhaul solutions, a radar system.

For example, the integrated circuit package assemblies 52, 54, 56, 58 or 60 may be used as a radar sensor working at any frequency range suitable for the specific radar system. For example, in a short detection range, e.g. within 5 to 10 meters detection range, the radar sensors may be working at a frequency range of 24-25 GHz, for an intermediate and long detection range, e.g. within 100 meters detection range and beyond, the radar sensors may be working at a frequency range of 76-81 GHz.

Figure 12:
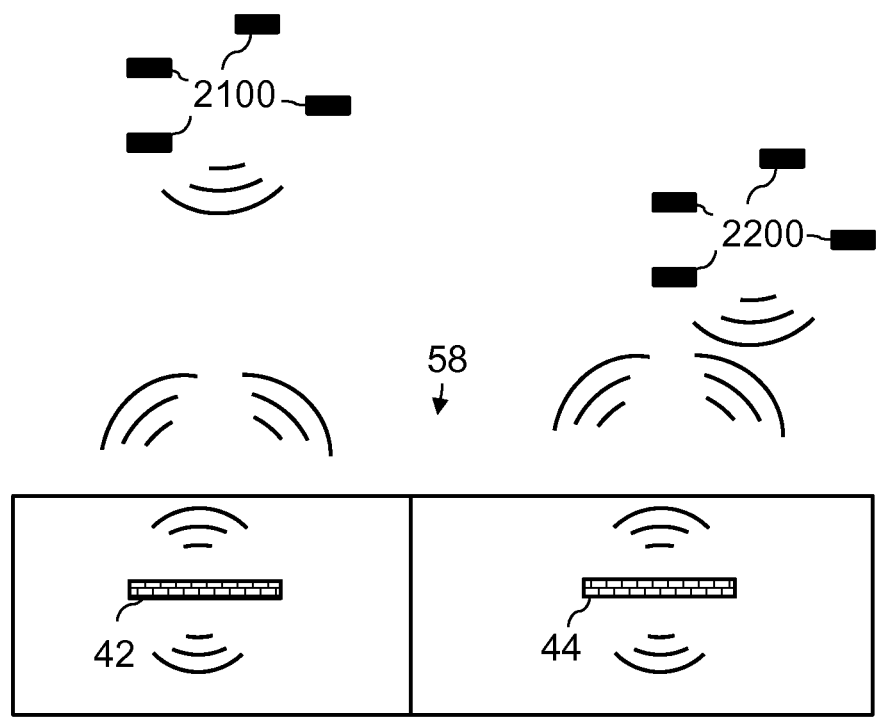
FIG. 12 schematically shows an example of an integrated circuit package assembly used as a radar sensor.

FIG. 12 schematically shows an example of a radar sensor. The integrated circuit package assembly 58 described with reference to FIGS. 8-10 may be for example used as a radar sensor. The first integrated antenna structure 42 may be arranged to transmit and/or receive the first RF signal in a first predetermined frequency band. The second integrated antenna structure 44 may be arranged to transmit and/or receive the second RF signal in a second predetermined frequency band. The first predetermined band may overlap the second predetermined frequency band. The first predetermined band may not overlap the second predetermined frequency band. The first integrated antenna structure 42 may be, as described with reference to the example shown in FIG. 9, to a transceiver arranged to transmit and/or receive in the first predetermined frequency band. The second integrated antenna structure 44 may be coupled to the same or another transceiver arranged to transmit and/or receive in the second predetermined frequency band. The radar sensor 58 may detect a first set of targets 2100 within a first predetermined detection range and a second set of targets 2200 within a second predetermined detection range. Alternatively or additionally, the radar sensor 58 may detect a first set of targets 2100 within a first predetermined velocity range and a second set of targets 2200 within a second predetermined velocity range. The radar sensor 58 may use the first predetermined frequency band to detect the first set of targets 2100 within the first detection range and the second predetermined frequency band to detect the second set of targets 2200 within the second detection range. Alternatively or additionally, the radar sensor 58 may use the first predetermined frequency band to detect the second set of targets 2200 within the first velocity range and the second predetermined frequency band to detect the second set of targets 2200 within the second predetermined velocity range. The first predetermined detection range may be smaller or higher than the second predetermined detection range. The first predetermined velocity range may be smaller or higher than the second predetermined velocity range.

In the foregoing specification, the invention has been described with reference to specific examples of embodiments of the invention. It will, however, be evident that various modifications and changes may be made therein without departing from the scope of the invention as set forth in the appended claims. For example, the electrical connections may be any type of electrical connection suitable to transfer signals from or to the respective nodes, units or devices, for example via intermediate devices. Accordingly, unless implied or stated otherwise the connections may for example be direct connections or indirect connections. For example the integrated circuit packages 14, 16, 18 described with reference to the FIGS. 1-3 and 6-11 are mounted on the respective PCB 90 or 91 via solder balls 110 and 111. However, other type of connections may electrically connect the integrated circuit packages 14, 16, 18 to the respective PCBs 90 or 91, e.g. conductive epoxy or bondwires.

Also, devices functionally forming separate devices may be integrated in a single physical device. For example, as shown in FIG. 9, a single integrated circuits die 60 may integrate a transmitter and a receiver. However, the transmitter and the receiver may be integrated in separate integrated circuit dies both electrically coupled to the respective integrated antenna structures. The separate integrated circuit dies may be electrically coupled to the respective first and second integrated antenna structures 42 and 44 for transmitting and/or receiving the respective first and second RF signals in the respective first and second predetermined frequency bands.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit package having a first side and a second side opposite to the first side, the integrated circuit package comprising:
   a stack of layers comprising at least a first electrically isolating layer and a second electrically isolating layer, the stack of layers being arranged at the first side of the integrated circuit package,
   a dielectric material arranged on the stack of layers at the second side for encapsulating the integrated circuit package,
   a first integrated antenna structure for transmitting and/or receiving a first radio frequency signal, the first integrated antenna structure being arranged between the first electrically isolating layer and the second electrically isolating layer,
   a first array of electrically conductive vias extending through at least the first electrically isolating layer and the dielectric material,
   the first integrated antenna structure being surrounded by the electrically conductive vias of the first array, the electrically conductive vias of the first array being electrically connected to respective first metal patches arranged on the dielectric material at the second side and separated from the integrated antenna structure by at least the dielectric material and the first electrically isolating layer.

2. An integrated circuit package according to claim 1, the respective first metal patches being electrically connected to form a first metal path substantially surrounding the integrated antenna structure.

3. An integrated circuit package according to claim 2, the first metal path being closed to form a first ring surrounding the first integrated antenna structure.

4. An integrated circuit package according to claim 2, the first metal path being open in correspondence with an input of the first integrated antenna structure.

5. An integrated circuit package according to claim 1, the electrically conductive vias being further electrically connected by a metal wall encapsulated by the dielectric material partially extending through the dielectric material and surrounding the integrated antenna structure.

6. An integrated circuit package according to claim 1, the first integrated antenna structure being arranged for partly overlapping an electrically conductive layer, the electrically conductive layer being separated from the first integrated antenna structure by at least the second electrically isolating layer, the electrically conductive layer being arranged to reflect the radio frequency signal received by the electrically conductive layer through at least the second electrically isolating layer to the second side.

7. An integrated circuit package according to claim 6, the stack of layers further comprising one or more electrically isolating layers for separating the first integrated antenna structure from the electrically conductive layer.

8. An integrated circuit package according to claim 6, the electrical conductive layer and/or the electrically conductive vias of the first array being electrically connected to a reference potential.

9. An integrated circuit package according to claim 1, the integrated antenna structure being electrically coupled to an integrated circuit die via one or more electrically conductive vias extending through at least the first electrically isolating layer, the integrated circuit die being arranged to generate the radio frequency signal for transmission via the integrated antenna structure and/or to receive the radio frequency signal as received via the integrated antenna structure.

10. An integrated circuit package according to claim 9, the integrated circuit die being arranged inside the integrated circuit package and having a surface in direct contact with a surface of stack opposite to the second side.

11. An integrated circuit package assembly according to claim 9, the integrated circuit die comprising a circuit of the group of circuits consisting of: a transmitter, a receiver, and a transceiver, the circuit being electrically coupled to the first integrated antenna structure.

12. An integrated circuit package according to claim 1, further comprising:
   a second integrated antenna structure for transmitting a second radio frequency signal, the second integrated antenna structure being arranged between the first electrically isolating layer and the second electrically isolating layer, and
   a second array of electrically conductive vias extending through at least the first electrically isolating layer and the dielectric material,
   the second integrated antenna structure being surrounded by the electrically conductive vias of the second array, the electrically conductive vias of the second array being electrically connected to respective second metal patches arranged on the dielectric material at the second side and separated from the second integrated antenna structure by at least the dielectric material and the first electrically isolating layer.

13. An integrated circuit package according to claim 12, the respective second metal patches being electrically connected to form a second metal path.

14. An integrated circuit package according to claim 13, the second metal path being closed to form a second ring surrounding the second integrated antenna structure.

15. An integrated circuit package according to claim 12, the second electrically conductive vias of the second array being electrically connected by a second metal wall encapsulated by the dielectric material partially extending through the dielectric material and surrounding the second integrated antenna structure.

16. An integrated circuit package according to claim 12, the second integrated antenna structure being electrically coupled to an integrated circuit die via second one or more electrically conductive vias through at least the first electrically isolating layer, the integrated circuit die being arranged to transmit the second radio frequency signal via the second integrated antenna structure and/or to receive the second radio frequency signal via the second integrated antenna structure.

17. An integrated circuit package assembly comprising the integrated circuit package according to claim 1, the integrated circuit package assembly further comprising a printed circuit board for mounting the integrated circuit package on the printed circuit board at the first side.

18. An integrated circuit package assembly according to claim 17, the printed circuit board comprising the electrically conductive layer.

19. An integrated circuit package assembly as claimed in claim 17, the integrated circuit package assembly being used as a radar sensor for detecting targets in a field of view and arranged for transmitting and/or receiving the first radio frequency signal through a first predetermined frequency channel.

* * * * *